US012622312B2

(12) United States Patent
Carney et al.

(10) Patent No.: US 12,622,312 B2
(45) Date of Patent: May 5, 2026

(54) MULTICHIP MODULE SUPPORTS AND RELATED METHODS

(71) Applicant: SEMICONDUCTOR COMPONENTS INDUSTRIES, LLC, Phoenix, AZ (US)

(72) Inventors: Francis J. Carney, Mesa, AZ (US); Michael J. Seddon, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 948 days.

(21) Appl. No.: 17/816,450

(22) Filed: Aug. 1, 2022

(65) Prior Publication Data

US 2022/0367305 A1      Nov. 17, 2022

Related U.S. Application Data

(62) Division of application No. 16/862,152, filed on Apr. 29, 2020, now Pat. No. 11,437,291.

(51) Int. Cl.
| | |
|---|---|
| *H01L 23/31* | (2006.01) |
| *H01L 23/00* | (2006.01) |
| *H01L 23/528* | (2006.01) |
| *H01L 23/60* | (2006.01) |

(52) U.S. Cl.
CPC ............ *H01L 23/31* (2013.01); *H01L 23/528* (2013.01); *H01L 23/562* (2013.01); *H01L 23/60* (2013.01)

(58) Field of Classification Search
None
See application file for complete search history.

(56) References Cited

U.S. PATENT DOCUMENTS

| | | | |
|---|---|---|---|
| 9,899,285 B2 | 2/2018 | Ho et al. | |
| 9,899,337 B2 | 2/2018 | Chang et al. | |
| 10,109,598 B2 | 10/2018 | Hu | |
| 10,276,551 B2 | 4/2019 | Lin et al. | |
| 10,504,880 B2 | 12/2019 | Lin et al. | |
| 10,714,463 B2 | 7/2020 | Lin et al. | |
| 2004/0222508 A1 * | 11/2004 | Aoyagi ................... H01L 24/32 438/109 |
| 2011/0278736 A1 * | 11/2011 | Lin ......................... H01L 24/11 257/E21.507 |
| 2012/0104580 A1 | 5/2012 | Feng et al. | |
| 2016/0254233 A1 | 9/2016 | Hu | |
| 2017/0033026 A1 | 2/2017 | Ho et al. | |
| 2017/0047294 A1 | 2/2017 | Chang et al. | |
| 2018/0295717 A1 | 10/2018 | Yu et al. | |
| 2019/0006341 A1 | 1/2019 | Lin et al. | |

(Continued)

*Primary Examiner* — Bo B Jang

(74) *Attorney, Agent, or Firm* — IPTechLaw

(57) ABSTRACT

Implementations of a semiconductor device may include a first largest planar surface, a second largest planar surface and a thickness between the first largest planar surface and the second largest planar surface; and one of a permanent die support structure, a temporary die support structure, or any combination thereof coupled to one of the first largest planar surface, the second largest planar surface, the thickness, or any combination thereof. The first largest planar surface, the second largest planar surface, and the thickness may be formed by at least two semiconductor die. The warpage of one of the first largest planar surface or the second largest planar surface may be less than 200 microns.

20 Claims, 3 Drawing Sheets

(56)          References Cited

U.S. PATENT DOCUMENTS

| | | |
|---|---|---|
| 2019/0252363 A1 | 8/2019 | Lin et al. |
| 2020/0098739 A1 | 3/2020 | Lin et al. |
| 2020/0258751 A1 | 8/2020 | Seddon et al. |
| 2020/0279747 A1 | 9/2020 | Carney et al. |
| 2020/0286735 A1 | 9/2020 | Carney et al. |
| 2020/0286736 A1 | 9/2020 | Seddon et al. |
| 2020/0365408 A1 | 11/2020 | Seddon et al. |

* cited by examiner

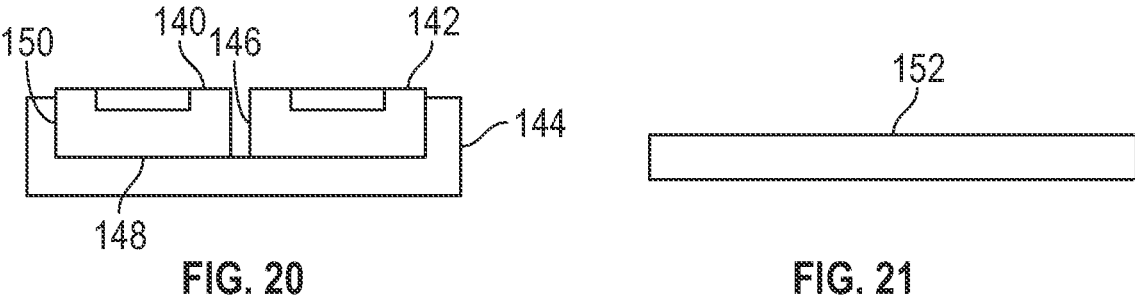
FIG. 20
FIG. 21
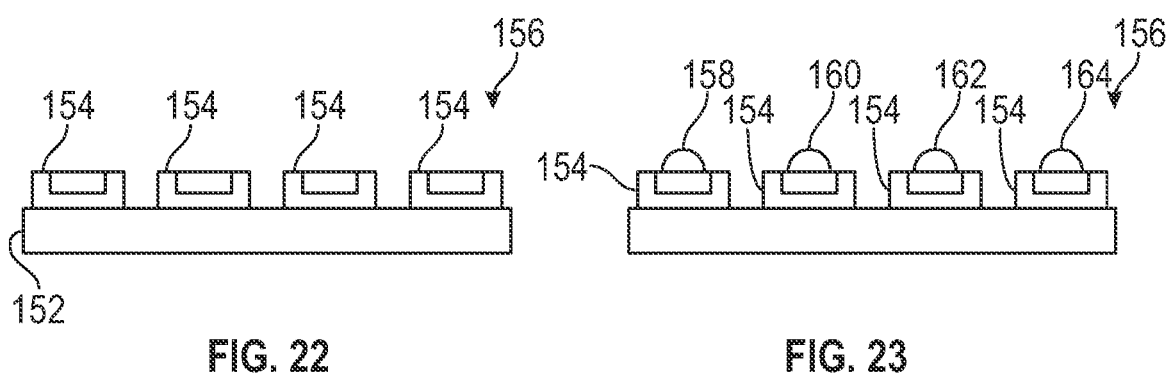
FIG. 22
FIG. 23
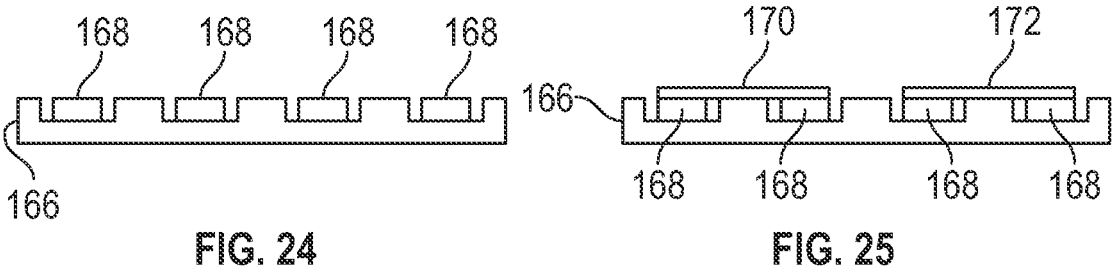
FIG. 24
FIG. 25
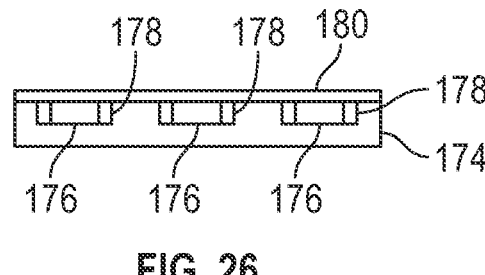
FIG. 26

MULTICHIP MODULE SUPPORTS AND RELATED METHODS

CROSS REFERENCE TO RELATED APPLICATIONS

This application is a divisional application of the earlier U.S. Utility patent application to Carney et al., entitled "Multichip Module Supports and Related Methods," application Ser. No. 16/862,152, filed Apr. 29, 2020, now pending, the disclosure of which is hereby incorporated entirely herein by reference.

BACKGROUND

1. Technical Field

Aspects of this document relate generally to semiconductor packages, such as wafer scale or chip scale packages. More specific implementations involve packages including an encapsulating or mold compound.

2. Background

Semiconductor packages work to facilitate electrical and physical connections to an electrical die or electrical component in the package. A protective cover or molding has generally covered portions of the semiconductor packages to protect the electrical die or electrical component from, among other things, the environment, electrostatic discharge, and electrical surges.

SUMMARY

Implementations of a semiconductor device may include a first largest planar surface, a second largest planar surface and a thickness between the first largest planar surface and the second largest planar surface; and one of a permanent die support structure, a temporary die support structure, or any combination thereof coupled to one of the first largest planar surface, the second largest planar surface, the thickness, or any combination thereof. The first largest planar surface, the second largest planar surface, and the thickness may be formed by at least two semiconductor die. The warpage of one of the first largest planar surface or the second largest planar surface may be less than 200 microns.

Implementations of semiconductor devices may include one, all, or any of the following:

The thickness may be between 0.1 microns and 125 microns.

The perimeter of at least two semiconductor die rectangular and a size of the at least two semiconductor die may be at least 6 mm by 6 mm.

The perimeter of the at least two semiconductor die may be rectangular and a size of the at least two semiconductor die may be 211 mm by 211 mm or smaller.

The permanent die support structure may include a mold compound.

The perimeter of the at least two semiconductor die may include a closed shape.

The one of the permanent die support structure, the temporary die support structure, or any combination thereof may include a perimeter including a closed shape.

The device may include a second permanent die support structure, a second temporary die support structure, or any combination thereof coupled to one of the first largest planar surface, the second largest planar surface, the thickness, or any combination thereof.

The permanent die support structure, the temporary die support structure, or any combination thereof may include two or more layers.

Implementations of a die support structure may include a material configured to be one of permanently coupled or temporarily coupled with a first largest planar surface, a second largest planar surface and a thickness between the first largest planar surface and the second largest planar surface where the material may be configured to be coupled to one of the first largest planar surface, the second largest planar surface, the thickness, or any combination thereof where the first largest planar surface, the second largest planar surface, and the thickness may be formed by at least two semiconductor die. The thickness may be between 0.1 microns and 125 microns.

Implementations of die support structures may include one, all, or any of the following:

The material may be configured to reduce a warpage of one of the first largest planar surface or the second largest planar surface to less than 200 microns.

The material may be a mold compound.

The material may be configured to be removable by one of exposure to light, ultrasonic energy, peeling, etching, grinding, or any combination thereof.

The material may include a perimeter including a closed shape.

The material may be a first portion of material and may include a second portion of material configured to be coupled to one of the first largest planar surface, the second largest planar surface, the thickness, or any combination thereof.

Implementations of a method of forming a die support structure may include one of permanently coupling or temporarily coupling a material with a first largest planar surface, a second largest planar surface, a thickness between the first largest planar surface and the second largest planar surface, or any combination thereof. The first largest planar surface, a second largest planar surface, and the thickness may be formed by at least two or more semiconductor die. Implementations may include reducing a warpage of one of the first largest planar surface or the second largest planar surface to less than 200 microns through the material.

Implementations of a method of forming a die support structure may include one, all, or any of the following:

The method may include removing the material using one of light, etching, peeling, ultrasonic energy, grinding, or any combination thereof.

The method may include removing the material after bonding the at least two or more die to one of a substrate, a leadframe, an additional die, a lead, a redistribution layer, and any combination thereof.

The material may be a first portion of material and may include: one of permanently coupling or temporarily coupling a second portion of material with one of the first largest planar surface, the second largest planar surface, the thickness, or any combination thereof.

The second portion of material may be a second layer of material coupled over the first portion of material.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 20 is a side view of an implementation of a temporary die support structure with two die coupled therein;

FIG. 21 is a side view of a permanent die support;

FIG. 22 is a side view of the permanent die support of FIG. 21 with a plurality of separate thinned die coupled thereto;

FIG. 23 is a side view of the permanent die support of FIG. 21 with a plurality of temporary die support structures coupled to each of the separate thinned die;

FIG. 24 is a side view of a jig/mold/guide with a plurality of separate thinned die coupled therein;

FIG. 25 is a side view of the jig of FIG. 24 with two implementations of temporary die support structures coupled to pairs of the plurality of thinned die;

FIG. 26 is a side view of a jig illustrating a permanent die support structure coupled to three separate thinned die.

DESCRIPTION

This disclosure, its aspects and implementations, are not limited to the specific components, assembly procedures or method elements disclosed herein. Many additional components, assembly procedures and/or method elements known in the art consistent with the intended multichip module supports will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such multichip module supports, and implementing components and methods, consistent with the intended operation and methods.

Figures 1, 2, 3:
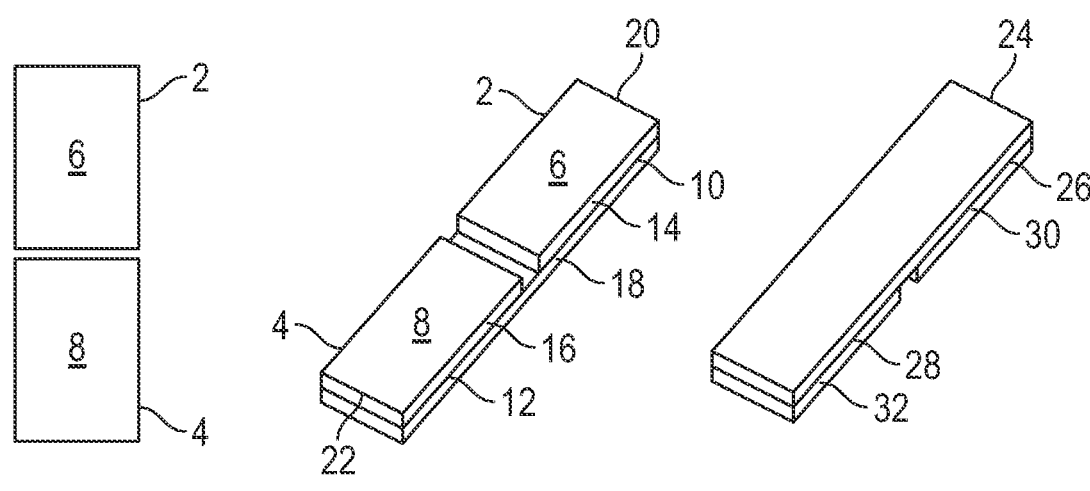
FIG. 1 is a top view of two separate semiconductor die.
FIG. 2 is a perspective view of the two semiconductor die of FIG. 1 coupled together via an implementation of a permanent die support structure coupled with a lower largest planar surface of each of the two semiconductor die.
FIG. 3 is a perspective view of the two semiconductor die of FIG. 1 coupled with an implementation of a temporary die support structure coupled with an upper largest planar surface of each of the two semiconductor die.

Referring to FIG. 1, an implementation of two separate thinned semiconductor die 2 is illustrated. Various implementations of groups of separate thinned semiconductor die disclosed in this document may be formed from a wide variety of semiconductor substrate types, including, by non-limiting example, silicon, polysilicon, silicon-on-insulator, glass, sapphire, ruby, gallium arsenide, silicon carbide, and any other semiconductor material type. Also, various implementations of groups of separate thinned semiconductor die may include die of any of a wide variety of shapes, including, by non-limiting example, rectangular, elliptical, triangular, polygonal, or any other closed shape. The various implementations of groups of thinned separate semiconductor die disclosed herein may include any of a wide variety of electronic devices, including, by non-limiting example, integrated bipolar junction transistors (IGBTs), metal oxide semiconductor field effect transistors (MOSFETs), diodes, power semiconductor devices, any semiconductor device disclosed in this document, any combination thereof, or any other active or passive semiconductor device or component, alone or in combination. As illustrated with reference to FIGS. 1 and 2, the two separate semiconductor die 2, 4 each have an upper largest planar surface 6, 8 and a lower largest planar surface 10, 12 with each having a thickness 14, 16 between them.

In various implementations disclosed herein, the thickness 14, 16 of the separate thinned semiconductor die may be between about 0.1 microns and about 125 microns. In other implementations, the thickness may be between about 0.1 microns and about 100 microns. In other implementations, the thickness may be between about 0.1 microns and about 75 microns. In other implementations, the thickness may be between about 0.1 microns and about 50 microns. In other implementations, the thickness may be between about 0.1 microns and about 25 microns. In other implementations, the thickness may be between about 0.1 microns and about 10 microns. In other implementations, thickness may be between 0.1 microns and about 5 microns. In other implementations, the thickness may be less than 5 microns.

The groups of separate various semiconductor die disclosed herein may form multichip modules of various sizes and each of the die in the multichip modules may have various sizes (die sizes). Die size generally refers to measured principal dimensions of the perimeter of the shape formed by a semiconductor die. For example, for a rectangular die that has a perimeter shaped like a square, the die size can be represented by referring to a height and width of the perimeter. In various implementations, the die size any one of the semiconductor die in a multichip module may be at least about 6 mm by about 6 mm. In other implementations, the die size may be smaller. In other implementations, the die size of at least one die in the semiconductor die may be about 211 mm by about 211 mm or smaller. For a semiconductor die with perimeter that is not rectangular, the surface area of the largest planar surface of the semiconductor die may be used as a representation of the die size.

One of the effects of thinning each of the separate semiconductor die is that is that as the thickness decreases, the largest planar surfaces of each die may tend to warp or bend in one or more directions as the thinned material of the die permits movement of the material under various forces. Similar warping or bending effects may be observed where the die size becomes much larger than the thickness of the die for large die above about 6 mm by about 6 mm or 36 mm² in surface area. These forces include tensile forces applied by stressed films, stress created through backgrinding, forces applied by backmetal formed onto a largest planar surface of the die, and/or forces induced by the structure of the one or more devices formed on and/or in the semiconductor die. This warping or bending of the thinned separate semiconductor die can prevent successful processing of the die through the remaining operations needed to form a semiconductor package around the die to allow it to ultimately function as, by non-limiting example, a module, a desired electronic component, processor, power semiconductor device, switch, or other active or passive electrical component. Being able to reduce the warpage below a desired threshold amount may permit the separate die to be successfully processed through the various operations, including, by non-limiting example, die bonding, die attach, package encapsulating, clip attach, lid attach, wire bonding, epoxy dispensing, pin attach, pin insertion, module attach, or any other process involved in forming a semiconductor package. In various implementations the warpage of the die coupled to the die support may need to be reduced to less than about 50 microns measured across a largest planar surface of the die between a highest and lowest point on the largest planar surface. In other implementations, by non-limiting example, where an assembly process involves Au—Si eutectic die attach, the warpage of the die coupled to the die support may need to be reduced to less than about 25 microns when measured across a largest planar surface of the die. In other implementations, by non-limiting example, where a die attach process utilizing solder paste is used, the warpage of the die coupled to the die support may need to be reduced to about 75 microns or less. In various implementations, the warpage of the die coupled to the die support may be reduced to below about 200 microns or less. In implementations where larger die are used, more warpage may be tolerated successfully in subsequent packaging operations, so while values less than 25 microns may be desirable for many die, depending on die size, more warpage than about 25, than about 50, than about 75 microns, or up to about 200 microns may be capable of being tolerated.

In various implementations, the warpage may be measured using various techniques. For example, a capacitative scanning system with two probes that utilize changes in the capacitance for each probe when a die or wafer is inserted into the gap between the probes to determine a wafer thickness and/or position can be utilized to map the warpage of a die or wafer. An example of such a capacitive system that may be utilized in various implementations may be the system marketed under the tradename PROFORMA 300ISA by MTI Instruments Inc. of Albany, N.Y. In other implementations, the warpage may be measured by a laser profilometer utilizing confocal sensors marketed under the tradename ACUITY by Schmitt Industries, Inc. of Portland, Oreg. In other implementations, any of the following shape/profile measurement systems marketed by Keyence Corporation of America of Itasca, Ill. could be employed to measure die or wafer warpage: the reflective confocal displacement sensor system marketed under the tradename CL-3000, the 2D laser profiling system marketed under the tradename LJ-V7000, or the 3D interferometric sensing system marketed under the tradename WI-5000.

Referring to FIG. 2, the two semiconductor die 2, 4 are illustrated coupled together through an implementation of a permanent die support structure (permanent die support, die support, multichip die support, multichip module support, multichip support) 18 is illustrated coupled to the two semiconductor die 2, 4. In this implementation, the multichip die support 18 is coupled to and coextensive with perimeters 20, 22 of largest planar surfaces 6, 8 of the two semiconductor die 2, 4. However, and as described in this document, the shape of the perimeters 20, 22 may each be a wide variety of shapes, including, by non-limiting example, rectangular, triangular, polygonal, elliptical, circular, or any other closed shape. The permanent die support structure 18 works to support the two semiconductor die during die packaging operations. Furthermore, the permanent die support structure 18 may include two or more portions, which will be described in this document.

While in the implementation illustrated in FIG. 2 the die support structure 18 is a permanent die support structure, in other implementations of die support structures disclosed in this document, the die supports structures may be temporary. Referring to FIG. 3, an implementation of a temporary multichip die support structure 24 coupled to the upper planar surfaces 26, 28 of two semiconductor die 30, 32 is illustrated. The temporary die support structure 24 is designed to be removably/releaseably coupled to the die 30, 32 and reduce the warpage of each of the die during die packaging operations.

In the implementations illustrated in FIGS. 2 and 3, the permanent die support structure 18 and the temporary die support structure 24 each include a material that is applied to the largest planar surface of each die of the thinned semiconductor die coupled to the dies support. The material reduces the warpage of each of the thinned semiconductor die in any of a wide variety of ways, such as, by non-limiting example, having a predetermined hardness value, having a predetermined stiffness value, having a predetermined Shore value, having a predetermined glass transition temperature, having a predetermined cure strength, having a predetermined thickness, having a predetermined film stress, curing at a particular temperature, curing with a particular temperature ramp profile, curing using specific light wavelengths, including one or more fillers, including one or more resins, or any other compound formation process parameter, mold compound ingredient, film parameter capable of affecting the warpage of the thinned semiconductor die. While a single layer of material is illustrated as being used as the permanent multichip die support in FIG. 2 or the temporary multichip die support in FIG. 3, in other implementations two or more layers of material may be employed to form the die support which contain either the same or different material compositions. These two or more layers may be applied simultaneously or sequentially in various implementations.

A wide variety of forms of materials may be employed in various implementations of temporary die supports, including, by non-limiting example, a coating (which may be applied, by non-limiting example, through painting, sputtering, evaporating, electroplating, electroless plating, or spraying or any other method of coating), a tape, a film, a printed structure, a screen printed structure, a stencil printed structure, an adhesive bonded structure, or any other material form capable of being removably or releaseably coupled with the surface of a semiconductor die. A wide variety of material types may be employed in various implementations of temporary die supports, including, by non-limiting example, polyimides, polybenzoxazoles, polyethylenes, metals, benzocyclobutenes (BCBs), photopolymers, adhesives, and any other material or combination of materials capable of being removably or releaseably coupled with a semiconductor die.

In various implementations, the material of the permanent die supports disclosed in this document may be mold compounds. In these implementations, the mold compound is not a polyimide material or other material generally specifically used to act as a passivating material for a semiconductor die surface. The mold compound may include any of a wide variety of compounds, including, by non-limiting example, encapsulants, epoxies, resins, polymers, polymer blends, fillers, particles, thermally conductive particles, electrically conductive particles, pigments, and any other material capable of assisting in forming a stable permanent supporting structure. In some implementations the mold compound may be non-electrically conductive (insulative). In other implementations, the mold compound may be electrically conductive, such as an anisotropic conductive film. In such implementations where the mold compound is electrically conductive, the mold compound is not a metal, but rather is formed as a matrix containing electrically conductive materials, such as, by non-limiting example, metal particles, graphene particles, graphite particles, metal fibers, graphene fibers, carbon fibers, carbon fiber particles, or any other electrically conductive particle or fiber. In various implementations, the mold compound may be a material which has a flexural strength of between about 13 N/mm$^2$ to 185 N/mm$^2$. Flexural strength is the ability of the mold compound to resist plastic deformation under load. Plastic deformation occurs when the mold compound no longer will return to its original dimensions after experiencing the load. For those implementations of permanent die support structures, flexural strength values of the mold compound to be used may generally be selected so that the chosen mold compound has sufficient flexural strength at the maximum expected operating temperature to avoid plastic deformation.

A wide variety of shapes and structures may be employed as permanent or temporary multichip die support structures in various implementations that may employ any of the material types, material forms, material parameters, or film parameters disclosed in this document to reduce the warpage of a group of thinned die to any of the desired levels disclosed in this document.

Figures 4, 5, 6:
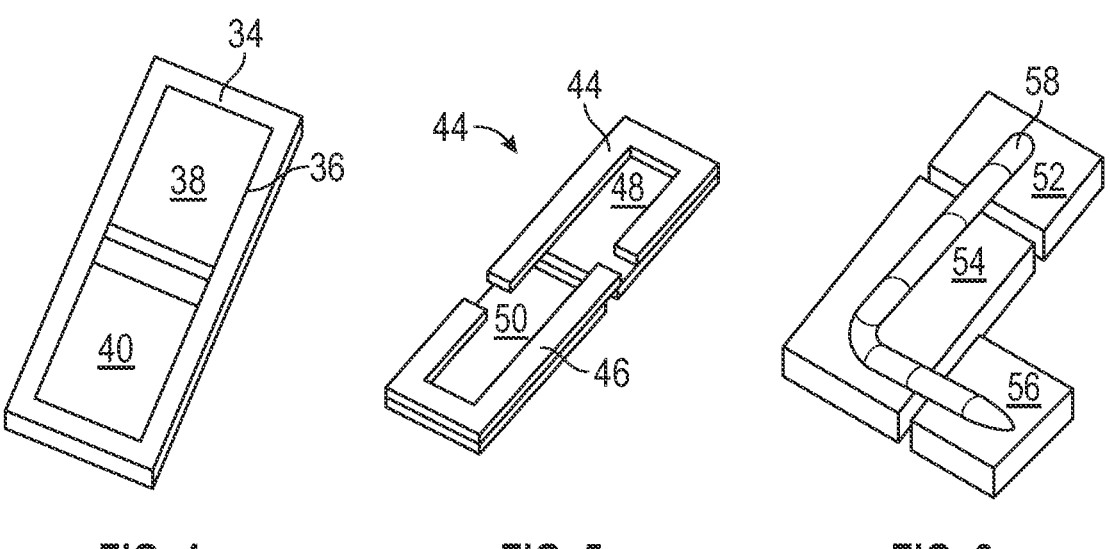
FIG. 4 is a perspective view of the two semiconductor die of FIG. 1 coupled with an implementation of a die support structure coupled at a thickness of each of the two semiconductor die.
FIG. 5 is a perspective view of an implementation of a die support structure that includes a first portion and a second portion coupled to a largest planar surface of each of two semiconductor die.
FIG. 6 is a perspective view of an implementation of a die support structure that is coupled along a largest planar surface of three separate semiconductor die.

Referring to FIG. 4, an implementation of a permanent die support structure 34 that is coupled at the thickness 36 of each semiconductor die 38, 40. In this implementation, the permanent die support structure 34 extends continuously around the thickness/perimeter 36 of each of the semiconductor die 38, 40. In this implementation, having the permanent die support structure 34 around the thickness 36 of each of the die 38, 40 may reduce the warpage of each of die 38, 40 to a desired level like any disclosed in this document.

Referring to FIG. 5, an implementation of a permanent die support structure 42 is illustrated that includes two C-shaped or U-shaped portions, a first portion 44 and a second portion 46. The first portion 44 and second portion 46 are separated by a gap along each side of semiconductor die 48, 50 which are coupled through the permanent die support structure 42. The material of the die support structure 42 in this implementation is included in the first portion 44 and second portion 46 and may be any material disclosed for use in a permanent die support structure disclosed in this document. In other implementations, the two C-shaped or U-shaped portions may alternatively be coupled across or over the thickness the group of semiconductor die. In other implementations, the U- or C-shaped first portion 44 and second portion 46 may be coupled to the lower largest planar surfaces of each of the semiconductor die rather than their upper largest planar surfaces. The same two U- or C-shaped structures may also be employed as a temporary die support for a two or more thinned semiconductor die in the same various coupling locations previously described in various implementations.

Referring to FIG. 6, a group of three separate semiconductor die 52, 54, 56 is illustrated where at least one of the die 54 has a different individual die and the group has a non-rectangular shape to its perimeter. An implementation of a temporary die support 58 is coupled to the upper largest planar surfaces of each die 52, 54, 56. In this implementation, the temporary die support 58 is used to maintain the warpage of each of the die 52, 54, 56 below a desired value until the die are attached to a substrate or other support and the need for the temporary die support 58 is no longer needed and it is removed.

Figure 7:
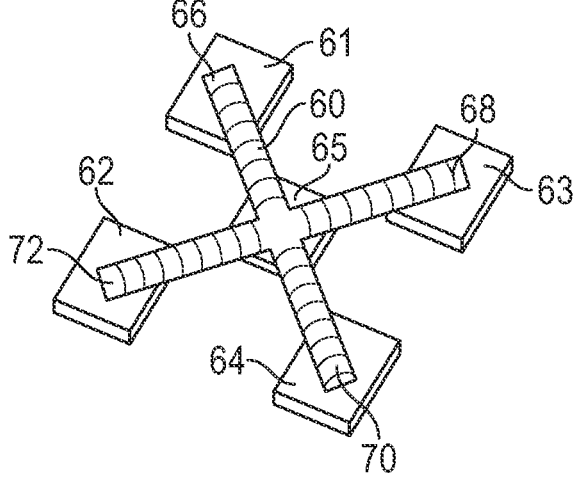
FIG. 7 is a perspective view of an implementation of an X-shaped die support structure coupled to five separate semiconductor die.

Referring to FIG. 7, an implementation of a permanent multichip die support structure 60 is illustrated. In this implementation, the structure 60 is formed of two intersecting lines of material, which are illustrated to be symmetric in at least one axis. In other implementations, however, the shape of the permanent die support structure 60 may be asymmetric about one or all axes. The locations along the upper or lower planar surfaces of the group of five semiconductor die 61, 62, 63, 64, 65 at which the structure 58 is coupled to the die may be determined by calculations based on, by non-limiting example, individual die size, individual die surface area, individual die shape, localized film properties, localized stress gradients, location(s) of semiconductor devices on/within the die, die thickness, die thickness uniformity, and any other parameter affecting the warpage of an individual semiconductor die. Also, in this implementation of a permanent die support structure 60, the length, orientation, and or position of each of the projections 66, 68, 70, 72 of the structure 60 may be calculated and/or determined using any of the previously mentioned parameters affecting the warpage of each of the die. In FIG. 7, the permanent die support 60 is illustrated with rounded side walls. However, in various implementations, different side wall profiles having straight or substantially straight side walls may be employed. In various implementations, the side wall profile of the permanent die support 60 may also be calculated/determined using any of the previously mentioned parameters that affect the warpage of a group of semiconductor die disclosed in this document. Various implementations of temporary die support structures may also utilize any of the aforementioned permanent die structures.

Various permanent and temporary die support implementations may take the form of a rod/long rectangle with straight or substantially straight side walls. As previously discussed, the profile of the side walls may be changed to assist in reducing the warpage of each die in a multichip module as can the location of the support and its orientation relative to the perimeter of the die. In various implementations, the rod may not be straight, but may be curved in one or more places to form, by non-limiting example, a C-shape, a U-shape, an S-shape, an N-shape, an M-shape, a W-shape, or any other curved or angled shape formed from one continuous piece of material (see FIG. 6).

In other implementations of permanent or temporary multichip die supports like those disclosed in this document, die support structures with a central portion from which a plurality of ribs project may be utilized. The number, location, and position of the ribs along the central portion may be determined/calculated using any of the previously discussed parameters that affect the warpage of each of the semiconductor die. The side wall profile of any or all of the ribs and/or the central portion may also be calculated in a similar way using the previously discussed parameters.

Figure 8:
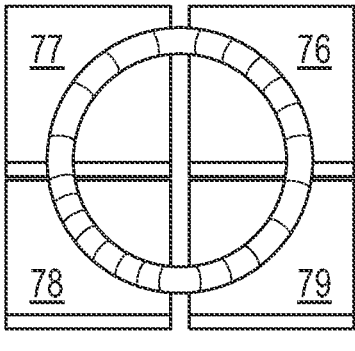
FIG. 8 is a top view of an implementation of an elliptically shaped die support structure coupled to four separate semiconductor die.

In various implementations, the temporary or permanent multichip die support need not be a shape with straight edges/lines, but, like the implementation of a temporary die support 74 illustrated in FIG. 8, may include an elliptical or spherical shape. In this implementation, the overall three-dimensional shape of the die support 74 is that of a rounded ring as the side wall profile of the material of the ring is rounded. In other implementations, however, the overall three-dimensional shape of the support 74 may be, by non-limiting example, a ring with straight or substantially straight sidewalls, cylindrical with straight side walls, conical with angled side walls, frustoconical with straight side walls and a flat upper surface, or any other three dimensional shape that is formed by projecting an elliptical cross-sectional shape upward from the largest planar surfaces of a group of separate die 76, 77, 78, 79.

In various implementations of temporary or permanent multichip die supports, various triangular shapes may be utilized. For those supports that are triangular, the shape of the triangle may be acute, right, obtuse, equilateral, isosceles, or scalene in various implementations. As in the previously discussed, the side wall profile of the triangle and the placement of the die support along the largest planar surface of each semiconductor die in a multichip module may be determined by any of the previously mentioned parameters that affect the warpage of each die.

Figures 9, 10, 11, 12, 13, 14, 15, 16, 17, 18, 19:
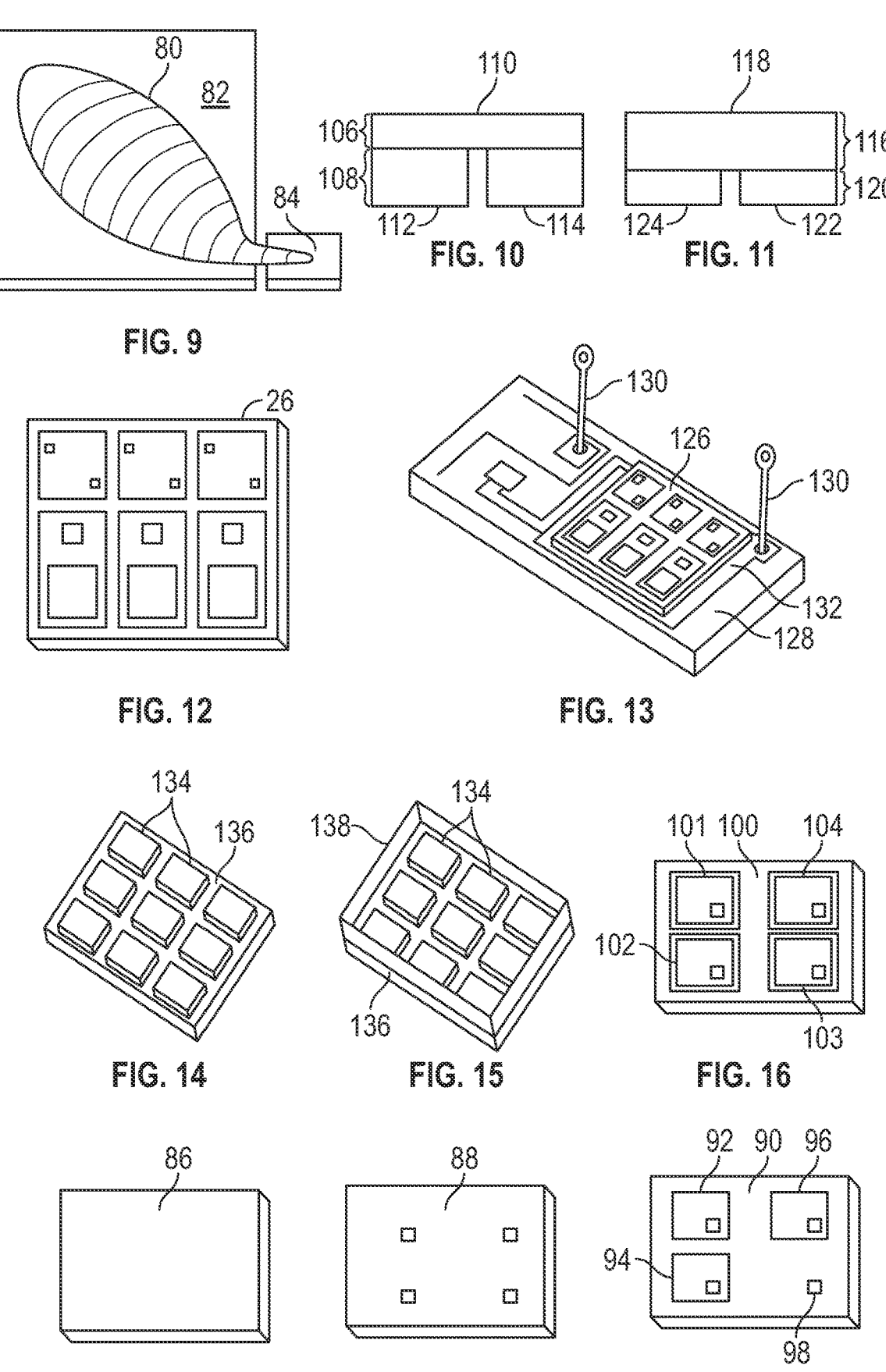
FIG. 9 is a top view of an implementation of an irregularly shaped die support structure coupled to two separate semiconductor die of different sizes.
FIG. 10 is a side view of an implementation of a die support structure coupled to two separate semiconductor die where the die support is thinner than the thickness of each of the two separate semiconductor die.
FIG. 11 is a side view of an implementation of a die support structure coupled to two separate semiconductor die where the die support is thicker than the thickness of each of the two separate semiconductor die.
FIG. 12 is a top view of an implementation of a permanent die support structure coupled with a plurality of die.
FIG. 13 is a perspective view of the implementation of a permanent die support structure of FIG. 12 coupled in a power integrated module.
FIG. 14 is a perspective view of an implementation of a permanent die support structure coupled with a plurality of image sensor die.
FIG. 15 is a perspective view of the implementation of a permanent die support structure of FIG. 14 with an optically transmissive cover coupled over the plurality of image sensor die.
FIG. 16 is a top view of an implementation of a temporary die support structure with four die coupled thereto.
FIG. 17 is a top view of an implementation of a permanent die support structure with four die coupled therein.
FIG. 18 is a top view of an implementation of a permanent die support structure with four die coupled therein showing connection openings therein.
FIG. 19 is a top view of an implementation of a permanent die support structure with four die coupled therein showing various connection openings therein.

Referring to FIG. 9, in various implementation of temporary or permanent multichip die supports the shape of the die support 80 may be irregular as determined by what is calculated to minimize the warpage of a particular configuration of multiple die. In the implementation illustrated, the two die 82, 84 are of different sizes, and so the die support 80 is designed to contact both but in different locations in order to minimize the warpage of the largest planar surfaces of each die. The sidewall profile of the die support 80, like previously discussed, is rounded as determined by what is needed to minimize the warpage of the largest planar surface of each die.

In various implementations, the permanent or temporary multichip die support can include more than one portion that is not directly attached to any other portion (see FIG. 5). In various implementations, the specific placement, sizing, and side wall profile of each of the portions may be determined by any of the previously mentioned parameters affecting warpage of each die in a multichip module. While in implementation illustrated in FIG. 5, the first portion 44 and second portion 46 are coupled to the largest planar surfaces of the die 48, 50 in other implementations the different portions may be coupled on/at the thickness of the various semiconductor die in a manner similar to the implementation illustrated in FIG. 4. In some implementations, first, second, third, and fourth portions may be coupled around each corner of the various separate die at the thickness of each of the semiconductor die. In other implementations, four portions may be included but may be coupled at the thickness at the midpoint of each side of the separate semiconductor die. In various implementations, portions coupled at the thickness may take a variety of other shapes, including, by non-limiting example, semicircular, triangular, square, angled, or any other closed shape. In other implementations, a single permanent or temporary die support structure may be coupled along a side of the separate semiconductor die at their thickness; in others, the single permanent or temporary die support structure may be coupled on a side and may wrap around one or more corners of the semiconductor die.

In various implementations of temporary or permanent multichip die supports, the die support can take the form of a frame with curved sections extending across the largest planar surfaces of the separate die coupled through the support. The radius of curvature of the curved sections may be determined by any of the various parameters that govern warpage disclosed in this document. While the curved sections may be symmetrically distributed about the frame, in various implementations they may be, by non-limiting example, asymmetric about one or more axes, have different radii of curvature, extend from any side of the frame, include one or more sections, extend nearly across the dimension of the frame, or be placed as determined by any of the parameters that control warpage of semiconductor die disclosed in this document.

In various implementations of permanent multichip die supports like those disclosed herein, a permanent die support material may fully enclose both of the largest planar surfaces and the thickness of each semiconductor die, as illustrated in the die support 86 illustrated in FIG. 17. Whether the die support fully encloses all six sides of each semiconductor die depends on the desired warpage values. In such implementations where the permanent die support completely covers one or more sides of the die, as illustrated in FIGS. 16, 18, and 19 one or more openings may be provided in/formed in the permanent die support through the material of the permanent die support to allow electrical or physical connections with one or more of the group of die. In various implementations, the openings to expose the electrical connectors for the various die in the multichip module may be formed by laser etching/ablating the material of the die support using a laser. In other implementations, the openings may be formed by chemically/plasma etching the material of the die support using a wet/dry/plasma etching process in various implementations. In the permanent die support implementation 88 illustrated in FIG. 18, four separate die are coupled through the support and the same die pad/lead of each die has an opening provided through the material. In the implementation of a permanent die support 90 illustrated in FIG. 19 of the four separate die, three have similarly shaped portions exposed through openings 92, 94, 96 that have the same while one has an opening 98 that is differently sized so the desired location on this die for the multichip module is exposed for electrical and/or physical contact. FIG. 16 illustrates a temporary die support 100 coupled to four die 101, 102, 103, 104 which shows that the die support completely covers five of the six sides of each die to provide the desired warpage control. In this implementation, the surface of the temporary die support 100 may be flush or substantially flush with the largest planar surfaces of each die as an aid in bonding each die to a substrate or other support disclosed in this document.

In various other implementations, permanent or temporary multichip die support material may extend over the thicknesses and the two largest planar surfaces of the semiconductor die. In such implementations, electrical and physical connections made be formed via the exposed largest planar surfaces and/or through openings in the material of the die support. A wide variety of possible configurations may be constructed to form electrical and physical connections with various separate semiconductor die to which a permanent or temporary die support like any disclosed in this document using the principles disclosed herein. In various implementations, the permanent die support material may be conformal, or conform to the shape of the die over which the material is coupled. In other implementations, the die support material may be non-conformal forming its own shape rather than assuming part of the shape of the die. In various implementations, the permanent die support material may be applied as a coating to the semiconductor die.

Referring to FIG. 10, in various implementations, a thickness 106 of the die support material 110 may be thinner than a thickness 108 of both of the semiconductor die 112, 114. While in FIG. 10 the thickness of the die 112, 114 is illustrated as being the same, in other implementations, the thickness of one, all, or any of the semiconductor multichip modules disclosed in this document may be differ from each other. In other implementations, as illustrated in FIG. 11, a thickness 116 of the die support material 118 may be thicker than a thickness 120 of each semiconductor 122, 124. The particular thickness and uniformity of the thickness of the die support material over the surfaces of each of the die may be determined using any of the factors influencing the warpage of a die disclosed herein.

Referring to FIG. 12, an implementation of a permanent multichip die support 126 is illustrated. In this die support 126, six separate die are coupled together, with the material of the die support 126 acting as an electrical isolation between each of the die. In this implementation, the material of the permanent die support 126 is a mold compound. As illustrated, a largest planar side of each die is exposed from the material of the permanent die support 126, allowing various electrical connections and/or physical connections to be made between the various die and a substrate or other structure to which the die will be coupled in subsequent packaging operations. Referring to FIG. 13, the die support 126 is illustrated coupled with a substrate 128 designed to be part of a power integration module. In this implementation, press fit pins 130 are coupled to traces 132 on the substrate. In this implementation, the permanent die support 126 forms a multichip module and has been bonded to the substrate on the side of the support that is made of mold compound. In such an implementation, any of the various thermally enhancing fillers, particles, and other materials may be added to the mold compound to facilitate heat transfer from the die through the mold compound to the substrate 128. In this implementation, various electrical connectors may be used to electrically couple the six die with the traces 132 of the substrate 128, such as, by non-limiting example, wirebonds, clips, wires, and any other electrical connector type.

In other implementations, the side of the permanent die support 126 that has the exposed die may be coupled to the substrate 128 as a multichip module. In such implementations the die may be, by non-limiting example, flip chip bonded, ball grid bonded, land grid bonded, pin grid bonded, soldered, bonded using an interposer, or any other method or process of forming electrical connections between the electrical connectors on the die with the substrate. A wide variety of multichip modules may be constructed using any of the permanent die supports or temporary die supports using the principles disclosed in this document. The die included in the permanent die support 126 may be power and/or control die in various implementations.

In other implementations, a multichip module may be formed using a permanent die support to create an array of image sensor die. Referring to FIG. 14, a plurality of image sensor die 134 may be coupled with permanent die support 136 to form an array of image sensor die as a multichip module. Referring to FIG. 15, the plurality of image sensor die 134 are now illustrated after an optically transmissive cover 138 has been coupled over the die, permitting various wavelengths of light to be received by the image sensor die 134. The permanent die support 136 may permit the thinned image sensor die 134 to be utilized by controlling the warpage of each die and 1) enable increased image sensor quality control and/or 2) enable high accuracy of placement of each image sensor die 134 relative to the others to enable image stitching to be accomplished among the plurality of die 134. A wide variety of possibilities for assembling various image sensor die may be constructed using the principles disclosed in this document.

The various implementations of permanent and temporary multichip die support structures disclosed herein may be formed using various methods of forming a die support structure. In a particular method implementation, the method includes permanently or temporarily coupling a material with two or more semiconductor die. This material may be a mold compound or any other material disclosed in this document used to form a permanent die support structure. This material may also be any material disclosed in this document used to form a temporary die support structure. The two or more semiconductor die may be any type disclosed herein that each include two largest planar surfaces with a thickness between the surfaces and the thickness may be any thickness disclosed in this document. The semiconductor device(s) included on the two or more semiconductor die may be any disclosed in this document. At the time where the material is permanently or temporarily coupled with the two or more semiconductor die, the material may be coupled with any, all, or any combination of a largest planar surface or thickness of the two or more die. The method includes reducing a warpage of a largest planar surface of each of the two or more semiconductor die to less than 50 microns through the coupling the material. In particular implementations the method may include reducing a warpage of a largest planar surface of each of the two or more semiconductor die to less than 25 microns.

As disclosed in this document, in various method implementations, the method includes permanently or temporarily coupling (or temporarily and permanently coupling in some implementations) two or more portions of material to the two or more semiconductor die to one, all, or any combination of the largest planar surface of each die or the thickness of each die. In various method implementations, the method may include permanently or temporarily coupling a second layer of material over the material originally permanently coupled with the semiconductor die. Additional layers beyond the second layer may also be coupled over the second layer in various method implementations.

In various method implementations, the point during the processing of the two or more semiconductor die where the permanent multichip die support structure is coupled may vary from implementation to implementation. In some method implementations, the point at where the permanent die support structure is applied occurs after (or could occur before) the semiconductor die have been physically singulated from among the plurality of semiconductor die being formed on a semiconductor substrate. Similarly, in various method implementations, the point in processing where a temporary multichip die support structure is coupled may vary from implementation to implementation. In some implementations the temporary die support may be attached prior to attachment of the two or more die to a substrate or other attachment structure, at which point the temporary die support is removed.

Referring to FIG. 20, two die 140, 142 are illustrated after coupling with a temporary multichip die support 144. As illustrated, the two die are separate in the temporary die support 144 and separated by gap 146. As illustrated in this implementation, the die support 144 may couple to both a largest planar surface 148 of each die and to a thickness 150 of each die.

Referring to FIG. 21, an implementation of a permanent multichip die support 152 is illustrated prior to coupling of die thereto. Referring to FIG. 22, an implementation of the permanent die support 152 is illustrated with die 154 coupled thereto. In this implementation, the die 154 may be bonded to the permanent die support 152 in a variety of ways, including, by non-limiting example, using a die bonding material, a die attach material, curing the material of the die support in contact with the die, sintering the material of the die support with the material of the die, and any other method of coupling a die with another material. After coupling of the die with the permanent die support 152, the system is now a multichip module. Referring to FIG. 23, the multichip module 156 is illustrated where an additional temporary die support 158, 160, 162, 164 has been coupled to each of the die 154. In this way, additional warpage control of the thinned die 154 may be accomplished during subsequent packaging steps involving the multichip module 156. In other implementations, however, the temporary die supports may not be utilized.

In various implementations, the ability to couple the separate die using a permanent or temporary die support may allow for very accurate placement of the die in a die module. This may allow a density of die in the module to increase. Also, in various implementations, reduction of pick and place steps can result from the use of permanent and/or temporary die supports because the die needed for a given product will already be coupled together as a module at the die attach step. Also, in various implementations, less spacing between the individual die in the module may need to be provided due to the increased accuracy of placement. In various implementations, and as discussed herein, additional electrical isolation materials or isolation trenches may need to be provided between the die in a die module. The additional isolation materials may be coupled to the permanent or temporary die support in various implementations. For example, the additional isolation materials may be any mold compound or temporary support material or other organic material disclosed herein. The additional isolation materials may be applied between the die prior to application of the permanent or temporary die support using a variety of methods, including, by non-limiting example, stencil printing, screen printing, squeegee application, or any other technique for applying material between the die. In other implementations, the additional isolation materials may be applied to or applied with the material of the permanent or temporary die support in the molding/support application process. In other implementations, however, the additional isolation materials may be, in the case of permanent die supports, the die support material itself that extends between the die.

Referring to FIG. 24, a side view of a jig/mold/guide 166 is illustrated with a plurality of thinned die 168 coupled therein. FIG. 25 illustrates the jig 166 after two implementations of temporary multichip die support structures 170, 172 are coupled to pairs of thinned die using the structure of the jig 166 as a support. In this way, the temporary multichip die support is able to reduce the warpage of each of the pairs of die 168 during further packaging processing steps.

In various method implementations, the temporary or permanent multichip die supports may be coupled prior to or after probing of the individual die/groups of die. Similarly, the temporary or permanent multichip die supports may be applied to a plurality of die on a semiconductor substrate prior to or after probing the plurality of die/groups of die.

Referring to FIG. 26, an implementation of a jig 174 is illustrated with three separate thinned die 176 coupled into openings 178 thereto after a permanent multichip die support 180 has been coupled thereto. In the implementation illustrated in FIG. 26 the material of the permanent multichip die support 180 does not penetrate down into the openings 178 along the thickness of each of the thinned die 176. In other implementations, however, particularly where a molding process is used to form the permanent die support, the material of the permanent die support 180 may extend partially or fully across the thickness of the thinned die. A wide variety of jig types may be constructed using the principles disclosed herein to enable the formation of various multichip modules using any of the various methods of applying a permanent or temporary dies support disclosed in this document.

In various method implementations, no precut or partial grooving between the plurality of die of a semiconductor substrate may be carried out. Where the plurality of die will be thinned, the depth of the die/saw streets/scribe lines may be sufficient to carry out the various methods of forming semiconductor packages disclosed herein. For example where a semiconductor substrate will be thinned to about 10 microns, the about 5 micron depth of the die streets into the material of the substrate/die resulting from the processing steps that form the separate semiconductor die suffices to act as the equivalent of any partial grooving/precutting. In various implementations, permanent or temporary multichip die support structures may be applied over the die leaving specific die streets exposed for subsequent processing.

In particular method implementations, the depth of the exposed die streets can be increased during the die fabrication process. In other particular method implementations, the depth of the exposed die streets may be increased during die preparation/packaging processes following die fabrication. In this way, any separate precut or partial grooving of the wafer using a saw or other process may be rendered unnecessary. Avoiding separately precutting/partial grooving may facilitate the sawing process and/or eliminate risk of sidewall cracking due to coefficient of thermal expansion (CTE) mismatches. While using the depth of the die streets to set sidewall coverage of mold compound rather than the depth of a precut into the semiconductor substrate may reduce the partial sidewall coverage for each die, the benefits may outweigh the additional coverage in various method implementations.

In various method implementations, temporary or permanent multichip die support structures may be coupled to the plurality of die while the semiconductor substrate while it is at full thickness, or, in other words, prior to any thinning operations being performed. Additional thinning operations can then be initiated with the temporary or permanent multichip die support structures in place. Also, for those processes where precut/grooving operations take place prior to thinning, these steps can take place after coupling of the temporary or permanent multichip die support structures.

In various method implementations, temporary or permanent multichip die support structures may be coupled over separated die after thinning is performed. In other implementations, the temporary or permanent multichip die support structures may be applied over the separated die after backmetal layer(s) have been applied to the semiconductor substrate. In yet other method implementations, the temporary or permanent multichip die support structures may be applied over the separated die after the semiconductor substrate has been only partially thinned, such as, by non-limiting example, through removing backside oxide prior to probing, an initial grinding step prior to a polishing/lapping step, or any other process which partially removes a layer of material or bulk material from the side of the semiconductor substrate opposite the die.

In various method implementations, the temporary or permanent multichip die support structures may be applied over the separated semiconductor die after a full backgrinding process is carried out but prior to or after a stress relief wet etching process has been carried out. In such implementations, the stress relief wet etching may be carried out with or without backmetal. In some implementations, the stress relief wet etching make take place after protecting the front side (die side) of the semiconductor substrate. The stress relief etching may reduce the backside damage to the semiconductor substrate that is caused by the backgrinding process. The use of the stress relief etching may also facilitate adhesion of the backmetal applied to the ground surface. In various implementations, the application of the temporary or permanent die support structures may be carried out prior to a backmetal formation process. A wide variety of sequences of method steps involving coupling of temporary or permanent die support structures may be carried out using the principles disclosed in this document for packaging process involving wafer scale operations like those disclosed in this document used for semiconductor substrates.

In various implementations, temporary or permanent multichip die support structures may be applied to a thinned semiconductor substrate prior to singulation of the thinned semiconductor die. In other implementations, temporary or permanent multichip die support structures may be coupled with the groups of thinned die after singulation but before picking of the thinned die while the thinned die are still supported on dicing tape. A wide variety of potential options may exist for the timing of when the temporary or permanent multichip support structures may be applied to the die during wafer scale packaging operations.

Similarly to the timing of applying temporary or permanent multichip die support structures during methods of wafer scale packaging semiconductor die, the timing may vary in various implementations of chip scale packaging semiconductor die. For example, a temporary or a permanent multichip die support structure may be applied individually to two or more die to form a multichip module. Temporary or permanent multichip die supports may be applied as the first step following die picking from a singulation tape, or immediately following die singulation prior to picking. In other method implementations, a temporary or permanent die support structure may be applied at or just prior to a later step in the process, such as, by non-limiting example, die attach, die underfilling, flux washing, epoxy cure, prior to a full encapsulating step, after lead frame attach, or any other chip scale packaging process operation. In various implementations, temporary die multichip supports may generally be applied prior to die attach, as after die attach there may be no further need for the temporary multichip die support. A wide variety of sequences of method steps involving coupling a temporary or permanent multichip die support structures may be employed in various method implementations using the principles disclosed in this document.

A wide variety of methods and processes may be employed to remove the temporary multichip die supports from the multichip modules at the point in the process where the temporary supports are no longer needed. Various implementations of temporary multichip die supports may be peeled off of the surface of multichip modules after or during exposure from a light source. This light source may be, by non-limiting example, a visible light source, an infrared light source, an ultraviolet light source, a laser light source, or any other source of light capable of acting to release or assist in releasing the temporary die support. For example, if the temporary die support was a UV release tape, then the support could be peeled from the surface of the multichip module with thinned die following exposure to a UV light source for a predetermined period of time after the multichip module had been attached to, by non-limiting example, a substrate, leadframe, another die, a lead, a redistribution layer, any combination thereof, or any other die bonding structure.

In various implementations, temporary multichip die supports may be etched from a multichip module using a plasma etching source. While a plasma etching source may be used, any other etching process could be employed in various implementations, including, by non-limiting example, a wet etching process, a spray etching process, a reactive ion etching process, an ion bombardment process, a lasering process, a grinding process, or any other process capable of reacting away or ablating the material of the temporary multichip die support.

In other implementations, the temporary multichip die support may be removed using energy assisting processes. In various implementations, a temporary die support may be separated from a multichip module with thinned die in a bath under ultrasonic energy produced by ultrasonic energy source. Under the influence of the compression waves in the fluid of the bath, the temporary multichip die support may separate without requiring any pulling force, or the peeling of the temporary multichip die support may be enabled by the ultrasonic energy. While the use of a bath 238 is illustrated, in various implementations a puddle may be used. In still other implementations, the ultrasonic energy may be directly or indirectly applied to the multichip module through a spindle, a chuck, a plate, or a liquid stream. In various implementations, the source of sonic energy may range from about 20 kHz to about 3 GHz. Where the sonic frequencies utilized by the ultrasonic energy source are above 360 kHz, the energy source may also be referred to as a megasonic energy source. In particular implementations, the sonic energy source may generate ultrasonic vibrations at a frequency of 40 kHz at a power of 80 W. In various implementations, the sonic energy source may apply a frequency of between about 30 kHz to about 50 kHz or about 35 kHz to about 45 kHz. However, in various implementations, frequencies higher than 50 kHz may be employed, including megasonic frequencies. A wide variety of power levels may also be employed in various implementations.

In various semiconductor package and method implementations disclosed in this document, any of the pads or electrical connectors disclosed in this document may be formed, by any or any combination of the following: evaporation, sputtering, soldering together, screen printing, solder screen printing, silver sintering one or more layers of materials. Any of the foregoing may also be used in combination with electroplating or electroless plating methods of forming pads and/or electrical connectors.

In places where the description above refers to particular implementations of multichip module supports and implementing components, sub-components, methods and sub-methods, it should be readily apparent that a number of modifications may be made without departing from the spirit thereof and that these implementations, implementing components, sub-components, methods and sub-methods may be applied to other multichip module supports.

What is claimed is:

1. A method of forming a semiconductor device package comprising:

permanently coupling a material to a first semiconductor die and to a second semiconductor die at a largest planar surface, a thickness, or any combination thereof of each of the first semiconductor die and the second semiconductor die; and reducing a warpage of the largest planar surface of the first semiconductor die and a warpage of the largest planar surface of the second semiconductor die comprised in the semiconductor device package to less than 200 microns through the material;

wherein the largest planar surface of the first semiconductor die and the largest planar surface of the second semiconductor die lie in a same plane.

2. The method of claim 1, wherein the material comprises two or more layers.

3. The method of claim 1, wherein the thickness is between 0.1 microns and 125 microns.

4. The method of claim 1, wherein permanently coupling the material to the first semiconductor die and to the second semiconductor die occurs after the first semiconductor die and the second semiconductor die have been singulated from a substrate comprising a plurality of semiconductor die.

5. The method of claim 1, wherein the material comprises a mold compound.

6. The method of claim 1, wherein a perimeter of the first semiconductor die comprises a closed shape and a perimeter of the second semiconductor die comprises a closed shape.

7. The method of claim 1, further comprising permanently coupling a second material to the first semiconductor die and to the second semiconductor die at the largest planar surface, the thickness, or any combination thereof of each of the first semiconductor die and the second semiconductor die.

8. The method of claim 7, wherein the material and the second material comprise permanent die support structures.

9. A method of forming a semiconductor device package comprising:

temporarily coupling a material to a first semiconductor die and to a second semiconductor die at a largest planar surface, a thickness, or any combination thereof of each of the first semiconductor die and the second semiconductor die;

reducing a warpage of the largest planar surface of the first semiconductor die and a warpage of the largest planar surface of the second semiconductor die comprised in the semiconductor device package to less than 200 microns through the material; and removing the material from the first semiconductor die and the second semiconductor die;

wherein the largest planar surface of the first semiconductor die and the largest planar surface of the second semiconductor die lie in a same plane.

10. The method of claim 9, further comprising removing the material using one of light, etching, peeling, ultrasonic energy, grinding, or any combination thereof.

11. The method of claim 9, further comprising removing the material after bonding the first semiconductor die and the second semiconductor die to one of a substrate, a leadframe, an additional die, a lead, a redistribution layer, or any combination thereof.

12. The method of claim 9, wherein the material comprises two or more layers.

13. The method of claim 9, wherein the thickness is between 0.1 microns and 125 microns.

14. The method of claim 9, wherein temporarily coupling the material to the first semiconductor die and to the second semiconductor die occurs after the first semiconductor die and the second semiconductor die have been singulated from a substrate comprising a plurality of semiconductor die.

15. A method of reinforcing a semiconductor device comprising:

one of permanently coupling or temporarily coupling a material to a first semiconductor die and to a second semiconductor die coupled together in a single semiconductor device at one of a largest planar surface, a thickness, or any combination of each of the first semiconductor die and the second semiconductor die; and reducing a warpage of the largest planar surface of the first semiconductor die and the largest planar surface of the second semiconductor die to less than 200 microns through the material;

wherein the largest planar surface of the first semiconductor die and the largest planar surface the second semiconductor die lie in a same plane when coupled together by the material.

16. The method of claim 15, wherein the thickness of the first semiconductor die and the thickness of the second semiconductor die are each between 0.1 microns and 125 microns.

17. The method of claim 15, wherein the material is a mold compound.

18. The method of claim 15, further comprising removing the material from the first semiconductor die and from the second semiconductor die using one of light, etching, peeling, ultrasonic energy, grinding, or any combination thereof.

19. The method of claim 15, wherein the material comprises two or more layers.

20. The method of claim 15, further comprising removing the material after bonding the first semiconductor die and the second semiconductor die to one of a substrate, a leadframe, an additional die, a lead, a redistribution layer, or any combination thereof.

* * * * *